United States Patent [19]
Burch

[11] Patent Number: 5,848,262
[45] Date of Patent: Dec. 8, 1998

[54] SIMULATING DIGITAL SYSTEMS BY USING VECTOR PROCESSING

[75] Inventor: Carl D. Burch, Mountain View, Calif.

[73] Assignee: Hewlett-Packard Company, Palo Alto, Calif.

[21] Appl. No.: 664,483

[22] Filed: Jun. 17, 1996

[51] Int. Cl.$^6$ .................................................. G06F 9/455
[52] U.S. Cl. .......................................................... 395/500
[58] Field of Search .............................. 395/500, 800.11, 395/183.06; 364/578; 371/37.2, 22.33; 375/241; 341/59; 370/84

[56] References Cited

U.S. PATENT DOCUMENTS

| | | | |
|---|---|---|---|
| 4,298,936 | 11/1981 | Shapiro | 395/800.11 |
| 4,605,921 | 8/1986 | Riddle et al. | 371/37.2 |
| 4,799,242 | 1/1989 | Vermeulen | 375/241 |
| 4,817,093 | 3/1989 | Jacobs et al. | 371/22.33 |
| 5,179,711 | 1/1993 | Vreeland | 341/59 |
| 5,398,241 | 3/1995 | Witchey | 370/84 |
| 5,574,853 | 11/1996 | Barch et al. | 395/183.06 |

*Primary Examiner*—Kevin J. Teska
*Assistant Examiner*—Dan Fiul

[57] ABSTRACT

The inventive software device simulates the cycles of a digital device on a computer system. The inventive simulator allows model bits to be computed in parallel and provides improved time-to-solution performance. The simulator uses words and bit-wise operations of the computer as vector processors. The simulator creates abstract representations having inputs and outputs for each component within the digital device. The simulator sorts the abstract representations to form groups of identical representations. Then, the simulator sequentially assigns each output of each representation in the group to one or more output words for that group. The concatenation of the output words for all groups is the output vector for the simulation. Next, the simulator maps each output bit to one or more offsets in an input vector for the simulation. Then, the simulator generates CPU instructions for each group that perform the bit calculations done by the represented component. The CPU instructions operate on the bits in the input vector to produce output bits stored in the output vector loop for each representation in the group. Finally, the simulator copies the bits from the output vector to the bits' mapped locations in the input vector to ready the next simulation cycle. This transforms the simulator into a loop-oriented application and reduces the code size of the model.

19 Claims, 6 Drawing Sheets

SIMULATING DIGITAL SYSTEMS BY USING VECTOR PROCESSING

TECHNICAL FIELD OF THE INVENTION

The present invention pertains generally to a system and method for simulating digital devices and particularly to a code generator that uses the words and bitwise operations of a conventional computer as miniature vector processors working on the devices' input and output bits.

BACKGROUND OF THE INVENTION

Prior art software simulators for microprocessors and other digital electronic devices work on a cycle-to-cycle simulation of the actions of each subdevice in the modeled hardware device. These cycle-based simulators compute each bit of the state of the modeled device at the end of a cycle from the results of the previous cycle's simulation. In this way, each cycle's output becomes the input to the subsequent cycle.

For digital devices, the calculation of each output bit is typically a very simple calculation from several input bits. Since digital devices have very few operations that they perform on a great many state bits, the instruction sequences used to simulate these operations are very repetitious. Also, the instruction sequences typically are all completely data-independent since no output produced is consumed until the next simulation cycle.

However, if the desired computation only has a few problems, that is, few input data sets to be simulated upon the device, then much of the computer's bandwidth is wasted. In other words, the computer system may be using 32-bit instructions to perform only 1-bit operations. Thus, prior art software simulators are very inefficient with respect to available computer bandwidth.

Moreover, the size of the instruction stream needed to implement software simulators for a complex digital system is very large. In addition, the instruction stream has very little of the locality of instructions referenced found in most computer programs. Since most computer systems are optimized to run more typical programs having smaller instruction streams and greater locality, these cycle-based simulation programs often exhibit very poor performance when executed due to excessive instruction-cache miss rates. Accordingly, such simulations often run at the speed of main memory or worse.

Various forms of parallelism have been used to speed up prior art cycle-based simulators. At a high level, disparate sections of the modeled device have been simulated in different programs or processes and run on parallel computers. At a lower level, simulators have been constructed that spread the bits of the model into bytes or words to solve. For example, eight or 32 separate simulation problems can be solved in parallel by operating on the same model bit in different logical problems. However, this sort of lower level parallelism only improves throughput of multiple problems, not individual problems.

Accordingly, there is a need in the art for a digital system simulator that uses an instruction stream small enough to be effectively cached by a modern computer system.

There is another need in the art for a digital system simulator that allows arbitrary tradeoffs of low-level parallelism between the number of problems and the time to solution.

There is yet another need in the art for a digital system simulator that utilizes the full bandwidth of the computer on which it is executed.

SUMMARY OF THE INVENTION

The above and other needs are met by a software digital system simulator (DSS) that allocates multiple model bits to machine words in input and output vectors. This design allows all model bits to be computed in parallel and gives far better time-to-solution performance. In essence, this design uses the words and bitwise operations of a conventional computer as miniature vector processors working on the bits.

A preferred embodiment of the DSS uses a six step process for vectorizing the calculations from individual bits to work on words. First, the DSS represents the individual bit calculations as a forest of abstract syntax trees (AST). Each root of an AST represents an output bit and each leaf node represents an input bit. The interior nodes represent an operation on the bits, usually either a Boolean operation or copy.

Second, the DSS performs a topological sort on the resulting AST forest to group together identical calculations. "Identical," in this case, refers to the contents and relative positions of interior nodes of the ASTs, not the input and output bits.

Third, the DSS assigns offsets for each output model bit in a particular AST group to the output word vector for that group. The concatenation of all of the AST groups' output word vectors is the whole model output bit vector. This assignment process implicitly vectorizes the computation of the individual bits into mini-vectors of up to the number of bits in a word.

Fourth, the DSS composes the input word vector for the AST group by constructing a one-to-many mapping from the output bits of one cycle to the input bits of a subsequent cycle. This mapping is performed for all AST groups and cycles. A preferred implementation of the mapping is as a lookup table constructed when the device simulation code is compiled.

Fifth, the DSS generates one set of instructions for each AST group. For AST groups that have multiple vectorized output words, the DSS generates loop code around the core set of instructions. The loops further improve code locality and reduce its size.

Sixth, at the beginning of each cycle, a library routine constructs the input word vector. A loop runs over the bits of the previous cycle's output vector and copies each bit to the input vector locations listed in the lookup table. Although the copy takes time proportional to the length of the input vector, this time is a relatively small payment for the large speedup and size reduction in the generated code. The copy loop is also very small and of very high locality, therefore further alleviating the instruction-cache pressure on the computer system.

The overall effect of the above-described DDS is to transform the simulation into a loop-oriented integer application with very little instruction-cache pressure. A DDS according to this design can be implemented in either native-code or a high-level language generation system.

A technical advantage of the present invention is that it reduces the total code size of a model on a massive scale, thereby greatly reducing instruction-cache pressure. This reduction alone greatly speeds up the DSS.

Another technical advantage of the present invention is that a code size reduction results from using only one copy of any computation pattern as the body of a loop over the words of the input and output vectors. Since there are only a small number of computation patterns compared to the number of bits on which the patterns are used, using a loop with a large number of iterations instead of inline copies of code sequences saves a large amount of code space.

Yet another technical advantage of the present invention is that it fully utilizes the available computer bandwidth. In most cases, the operations fully utilize all bits of every word.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
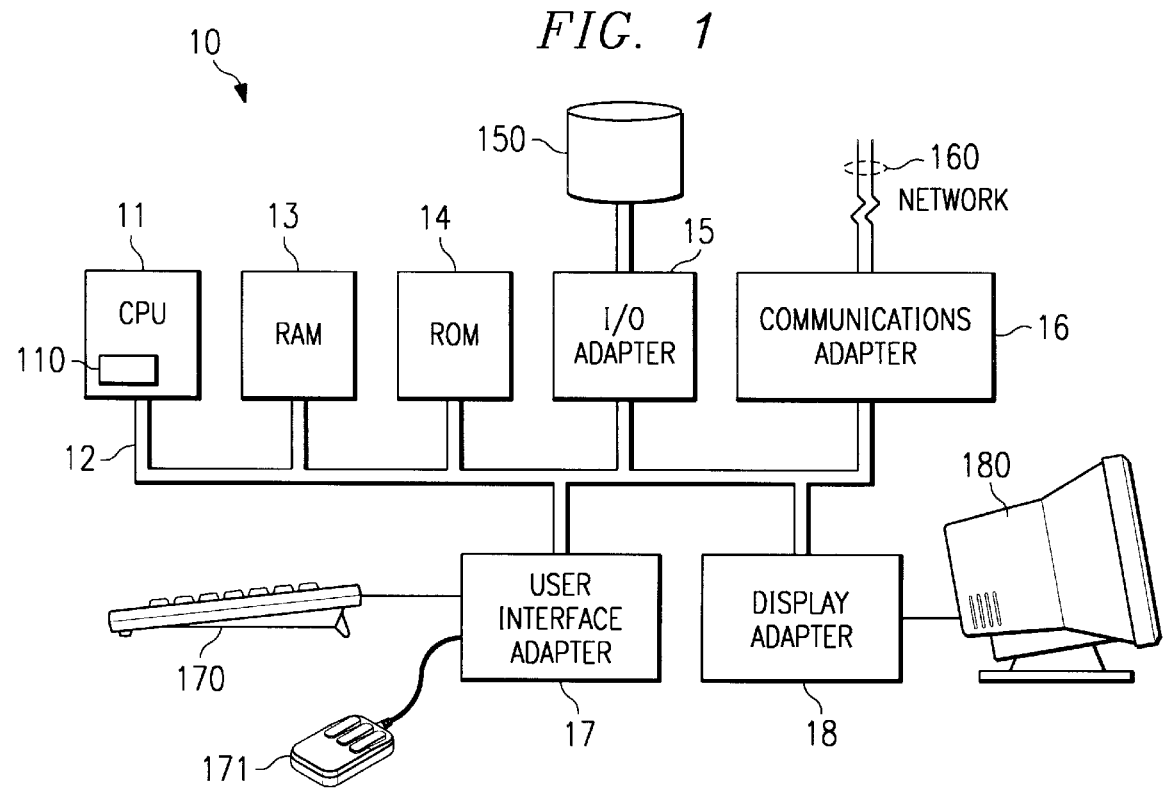
FIG. 1 is a computer system adapted to execute a software digital device simulator.

FIG. 1 illustrates computer system 10 adapted to execute the present invention. Central processing unit (CPU) 11 has an instruction cache 110 and is coupled to bus 12, which in turn is coupled to random access memory (RAM) 13, read only memory (ROM) 14, input/output (I/O) adapter 15, communications adapter 16, user interface adapter 17, and display adapter 18.

CPU 11 may be any general purpose CPU, such as a HP PA-8000. CPU 11 preferably has a reduced instruction set (RISC) architecture and supports at least 32-bit data words. However, the present invention is not restricted by the architecture of CPU 11. Thus, the present invention can be adapted to work with computers having, for example, a complex instruction set.

RAM 13 and ROM 14 hold user and system data and programs as is well known in the art. I/O adapter 15 connects storage devices, such as hard drive 150, to the computer system. Communications adaption 16 is adapted to couple the computer system to a local or wide-area network 160. User interface adapter 17 couples user input devices, such as keyboard 170 and pointing device 171, to the computer system. Finally, display adapter 18 is driven by CPU 11 to control the display on display device 180.

As is well known in the art, a software digital device simulation (DSS) embodying the present invention preferably is stored on hard drive 150 and executes from RAM 13 on CPU 11. A data file containing an abstract model of the simulated digital device is also stored on hard drive 150. The abstract model describes each of the components within the digital device and the interconnections between the components. Each component performs an operation on one or more inputs and produces at least one output.

The data file is read by the DSS. The DSS compiles the data file and generates code for simulating the device on computer system 10. This code typically consists of assembly language instructions performing the operations described by the abstract model. The below discussion centers on a method and system of compilation that generates highly optimized code for simulating the digital device.

Figure 2:
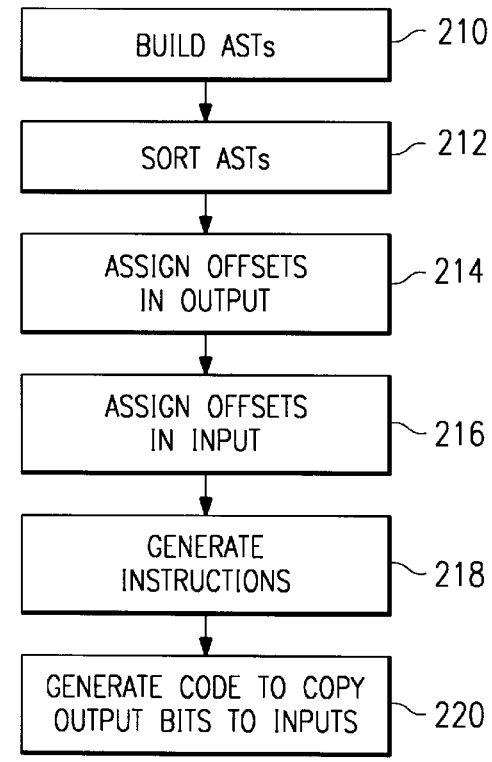
FIG. 2 is a high-level flow chart illustrating the present invention.

FIG. 2 is a high-level flow chart illustrating the process followed by a preferred embodiment of the DSS to generate optimized code using microvectorized instructions. Note that the steps of FIG. 2 are not necessarily in chronological order. At step 210, the DSS builds abstract syntax trees (ASTs) for each bit calculation in the modeled device. Each root of an AST represents an output bit of the calculation and each leaf node represents an input bit. The interior nodes can be, at the least, the Boolean logic operations and copy.

Figure 3:
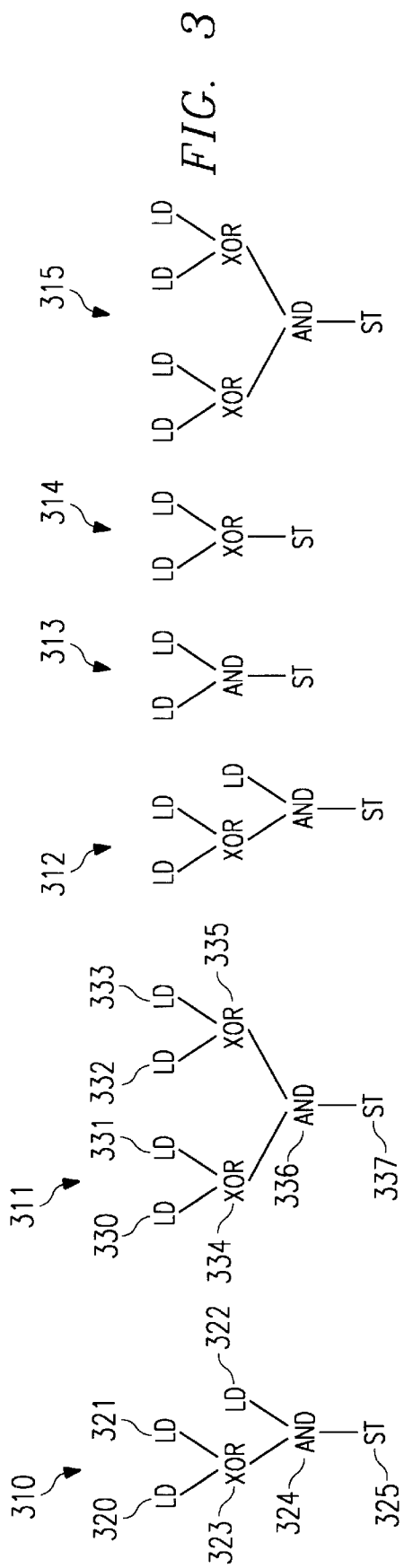
FIG. 3 illustrates an abstract syntax tree forest.

FIG. 3 illustrates sample ASTs generated by the DSS. Only six ASTs 310–315 are shown in FIG. 3, even though a real world simulation could have many thousands of ASTs. Each node of the ASTs is labeled to represent a computer instruction. The labels are defined as follows:

| | |
|---|---|
| LD | Load from memory |
| XOR | Boolean EXCLUSIVE-OR operation |
| AND | Boolean AND operation |
| ST | Store to memory. |

The LD instructions are input bits to the AST calculation while ST instructions are outputs.

Consider, for example, AST 310. AST 310 has three input bits 320–322. Input bits 320 and 321 are XORed 323 with each other and the resulting bit is ANDed 324 with input 322. The result of AND operation 324 is the output of the AST, as indicated by ST instruction 325.

Similarly, AST 311 takes four input bits 330–333. Input bits 330 and 331 are XORed by XOR operation 334. Likewise, input bits 332 and 333 are XORed by XOR operation 335. Then, the outputs of the XOR operations 334–335 are ANDed by AND operation 336. The result of AND operation 336 is the output of the AST, as indicated by ST instruction 325.

After the DSS builds the ASTs, the DSS performs a topological sort on the AST forest (step 212). This sort groups together ASTs representing identical calculations. "Identical," as used herein, means that the contents and relative positions of the interior nodes of the ASTs are the same, not the input and output bits.

Figure 4:
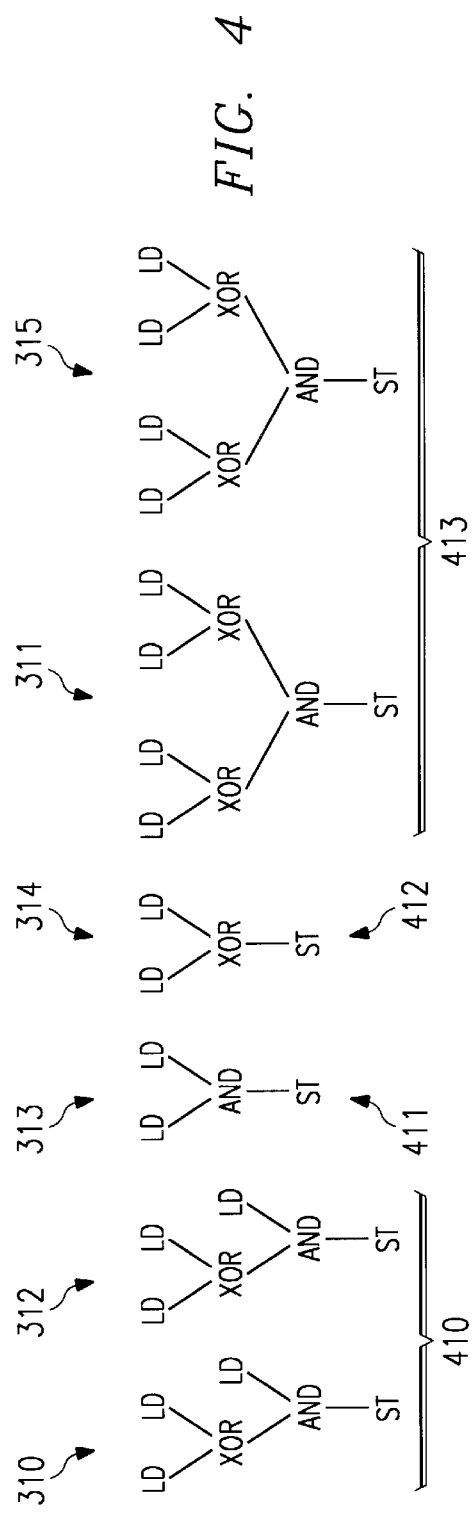
FIG. 4 illustrates sorted abstract syntax trees.

FIG. 4 illustrates a sorted list of the ASTs of FIG. 3. The ASTs have been sorted into four groups 410–413. ASTs 310 and 312 are in group 410. AST 313 is the sole member of group 411 and, similarly, AST 314 is the sole member of group 412. Finally, ASTs 311 and 315 are in group 413.

Once the ASTs have been sorted, the DSS assigns an offset for each AST's output bit in an output word vector for that AST group (step 214). If the number of output bits in the AST group exceeds the computer's word size, then additional words are used as is necessary. The concatenation of all of the words is the output vector for that group. Likewise, the concatenation of all groups' output vectors is the output vector for the whole model. This step implicitly vectorizes the computation of the individual bits into mini-vectors of up to the number of bits in a word.

Figure 5:
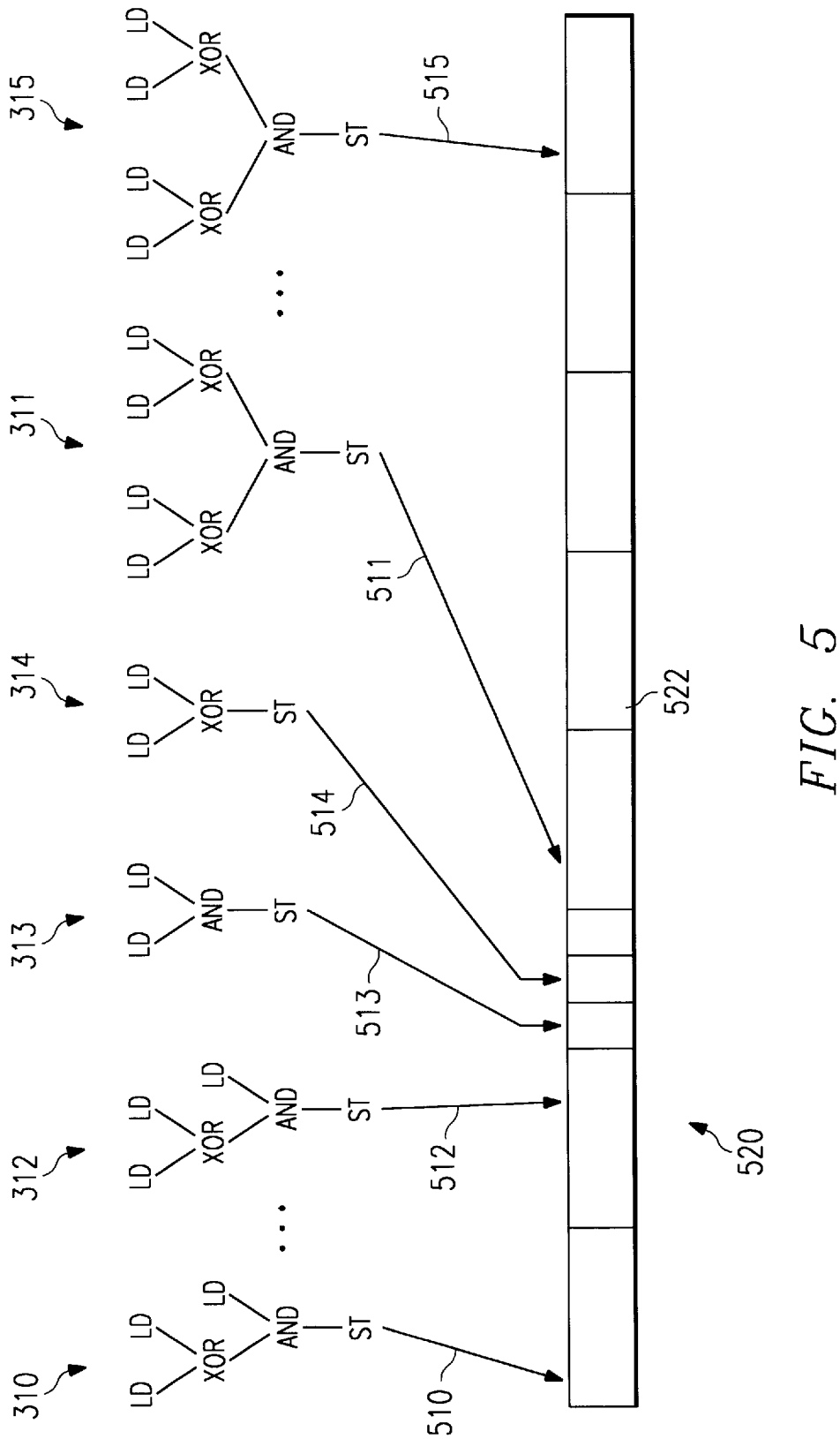
FIG. 5 illustrates assigning offsets to the output bits.

FIG. 5 illustrates the step of assigning offsets to the output bits. The sorted ASTs 310–315 are shown along the top of the figure. An arrow 510–515 connects the output bit of each AST 310–315 with an offset in the model's output vector 520. The vertical lines in the output vector 520, such as line 522, delineate the individual words that comprise the output vector 520.

Next, at step 216, the DSS assigns offsets in the input word vector for copies of each model bit. In other words, the DSS constructs a one-to-many mapping from the output bits of one cycle to the input vector of the subsequent cycle. This mapping is preferably implemented by constructing a lookup table when the simulation code is compiled. During execution, the DSS can determine where each output bit is mapped in the input vector by checking the table. In an alternative embodiment, the DSS constructs the input vector 612 by copying via table-lookup from the output vector 520.

Figure 6:
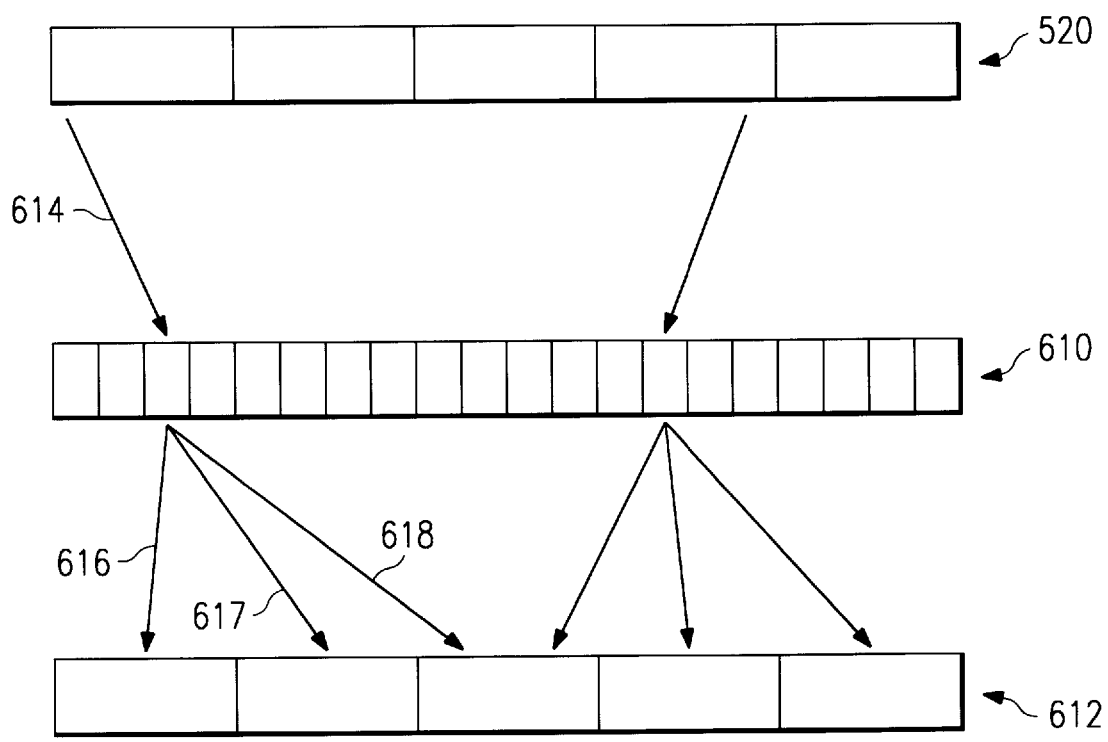
FIG. 6 illustrates the step of assigning offsets in the input word.

FIG. 6 illustrates the step of assigning offsets in the input word. Shown are the output vector 520, the lookup table 610, and the input vector 612. An arrow 614 extends from the output vector 520 to lookup table 610. This arrow 614 indicates that a particular bit in the output vector 520 corresponds to a particular entry in the lookup table 610. Arrows 616–618 from the lookup table 610 to the input vector 612 indicate that the output bit maps to three different bits in the input vector.

At step 218, the DSS generates one set of instructions for each AST group. Since each AST group contains ASTs that perform the same operations, the same set of instructions can be executed for each AST in the group. Then, the DSS generates loop code around the computational code such that the computation code executes for each AST in the group. This loop code further improves the code locality and reduces its size, thereby speeding up the execution of the simulation on computer system 10.

For example, AST 314, which performs an XOR operation, can be represented by the following assembly language code:

```
LDW   -6601(0,11),2
LDW   -6590(0,10),4
XOR   2,4,2
STW   2,-3365(0,6).
```

This short code sequence loads the input bits, performs an exclusive-or on the bits, then stores the result. If the AST group contains multiple ASTs, then the DSS could generate the following code loop:

```
          LDO      936(%r25),%r31
          LDO      2716(%r26),%r23
          LDI      -1000,%r24
          LDW      -4(%r23),%r25
$00000003
          LDW,MA   8(%r23),%r26
          XOR      %r25,%r26,%r29
          STW,MA   %r29,4(%r31)
$00000001
          ADDIB,<>,N       1,%r24,$00000003
          LDW -4(%r23),%r25
```

The above code loops for each AST in the group.

Figure 7:
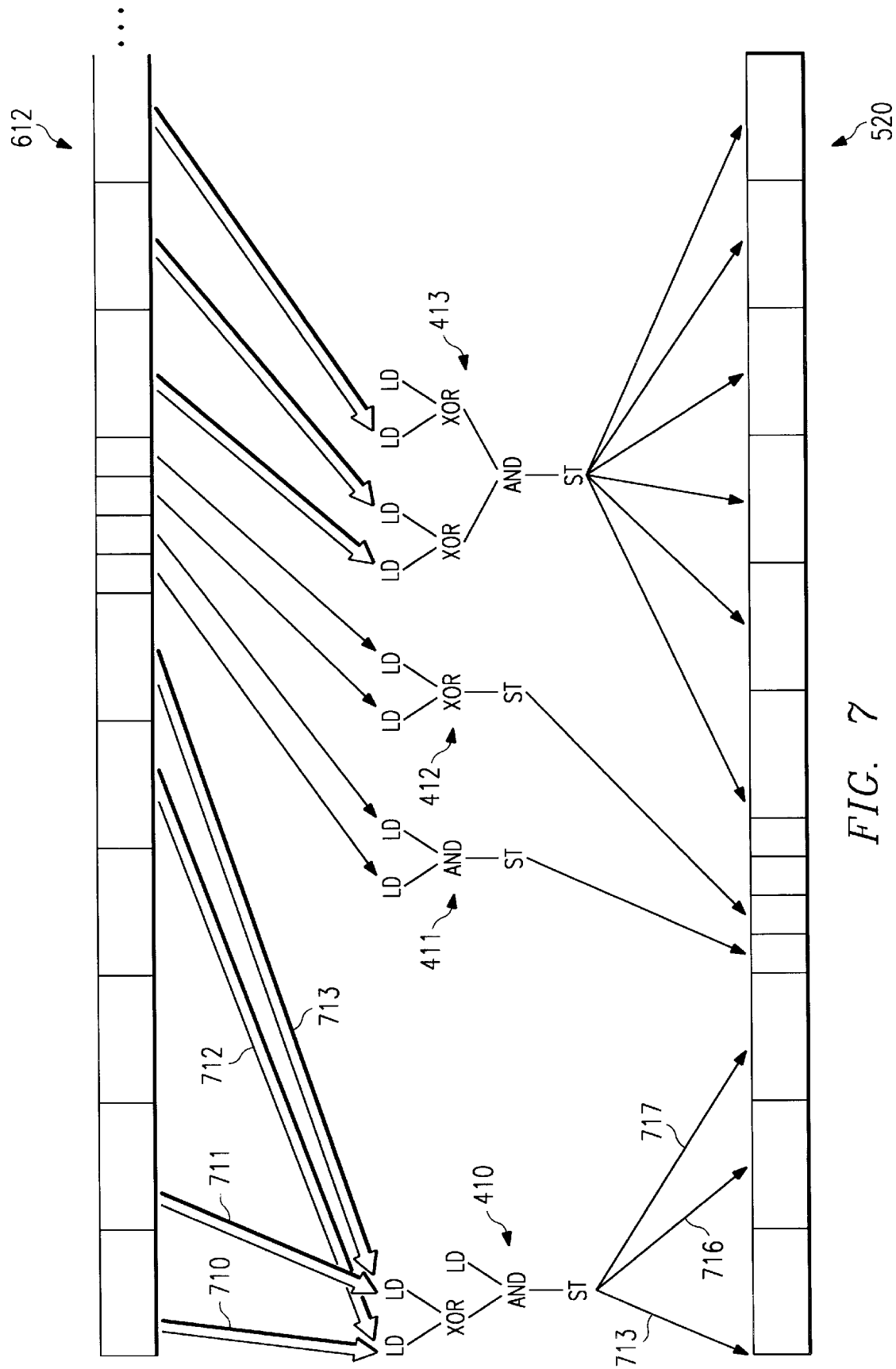
FIG. 7 illustrates the effects of code generated for an AST group.

FIG. 7 illustrates the effects of the code generation. Shown are one AST for each group 410–413, thereby indicating that each group has been reduced to a single code sequence. For certain AST groups, such as group 410, multiple arrows 710–713 are drawn from the input word vector 612 to the input bits of the AST. These multiple arrows indicate that the input bits have been mapped to multiple instances of the AST. That is, more than one AST in the group receives those input bits. Likewise, the multiple arrows 715–717 extending from the output of AST group 410 into output word vector 520 indicate that different instances of the AST save bits at different offsets in the output word vector 520.

Step 220 occurs at the end of each simulation cycle. Step 220 copies the output bits of each cycle to the input words of the subsequent cycle. This step is preferably performed by a library routine that executes after each cycle. The library routine contains a loop that runs over a list of bit locations in the previous cycle's output vector and copies each bit to successive bits in the words of the input vector. Although the copy operations take time proportional to the length of the input vector, this time is a relatively small payment for the large speedup and size reduction in the simulation code generated by the DSS.

The copying step 220 could also be implemented by controlling the assignment of the model bits' offsets to match the similar code generation patterns. For example, the offsets could be assigned such that the copying step can be implemented by wordwise operators.

Figure 8:
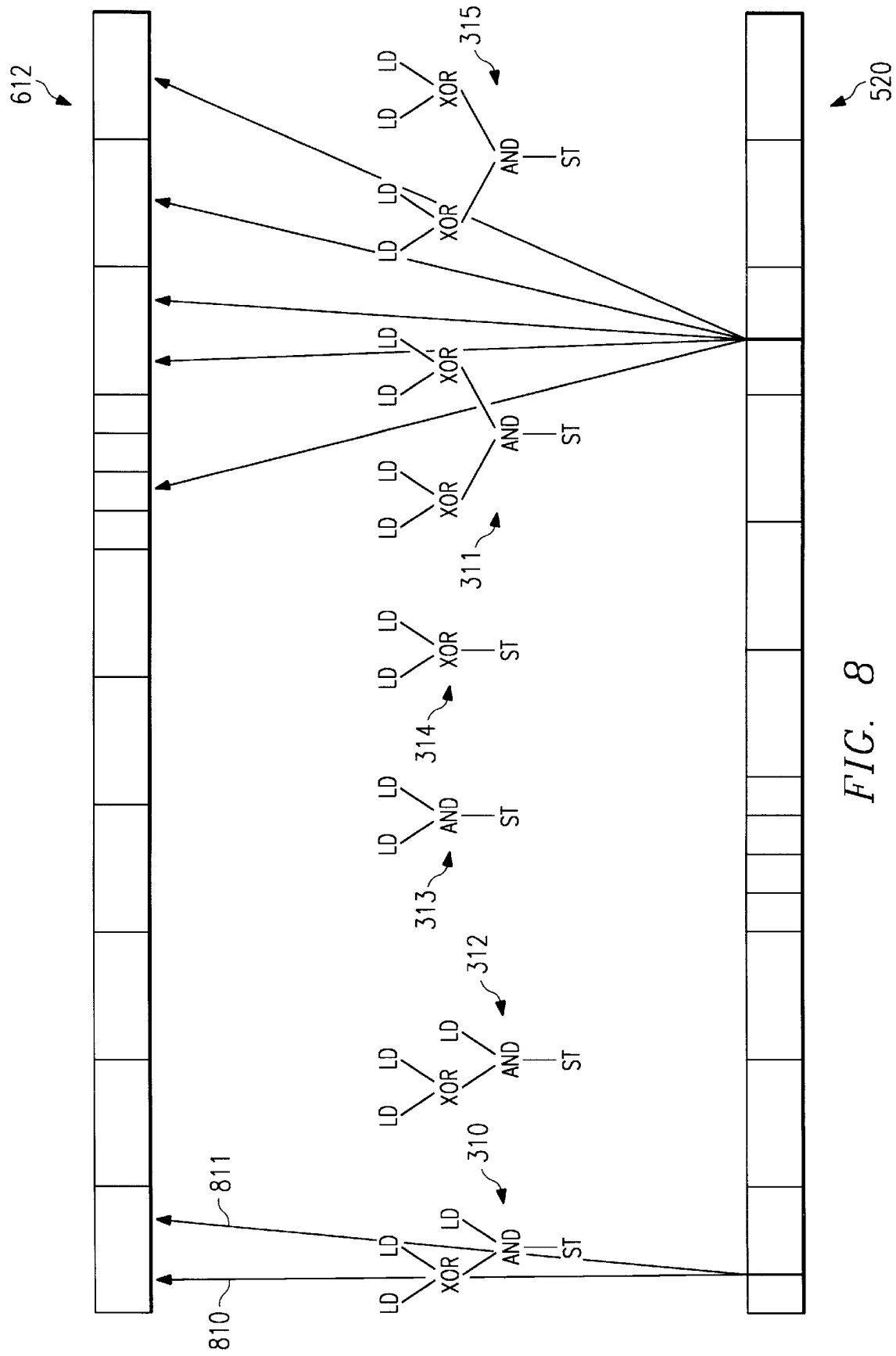
FIG. 8 illustrates copying output bits from one cycle to input words of a subsequent cycle.

FIG. 8 illustrates step 220. Shown are input word vector 612, output word vector 520, and ASTs 310–315. Arrows 810–811 extending from one location within output word vector 520 to multiple locations in input word vector 612 indicate that a single output bit is being copied into multiple offsets in the input vector.

The code size reduction made possible by the DSS with microvector optimization is immense. Consider a model, for example, with one million bits of state, wherein each model bit is referenced as an input an average of four times, there are 100 unique code generation patterns, and the computer system has 32-bit words.

From the sample model, the DSS with microvector optimization generates 100 code loops, one for each unique code generation pattern. Each loop outputs a mean of 10,000 bits. The output bits are organized into an output vector of 313 continuous 32-bit words. Each loop iterates an average of 313 times. Thus, the code size is reduced by 313 times, although the additional loop code causes the total code size reduction to only be about 150 times. Nevertheless, this 150 times reduction is enough to allow even large simulations to execute within instruction cache 110.

Occasionally, data dependencies can exist within a simulation cycle. A data dependency typically occurs when the results of an operation must be determined before a subsequent instruction can execute. Minimizing data dependencies becomes critical when executing code in parallel.

When data dependencies exist within a simulation cycle, the code can still be vectorized and optimized into microvectors by using the dependency information to control the AST forest sort in step 212. That is, AST trees using the outputs of prior calculations in that cycle as inputs would sort "after" AST trees not having such dependencies.

This sorting of ASTs by data dependencies can affect both ordering within a logical AST group and between AST groups. Dependencies between AST groups will affect the order of the loops emitted for each AST group. If the dependency requires copying of the later loop's input vector after the earlier loop computing the output bits on which the later loop is dependent, then the DSS can move the copying code to between the dependent loops rather than between the simulation cycles. Dependencies within an AST group can also be handled in this manner by partitioning AST groups with internal dependencies.

In addition, if data dependencies exist on a very broad scale, the DSS can segregate the dependent operations by breaking up a simulation cycle into two or more subcycles. Each subcycle would then use the method discussed in step 220 to copy the output bits to the input word vector.

Although the present invention and its advantages have been described in detail, it should be understood that various changes, substitutions and alterations can be made herein without departing from the spirit and scope of the invention as defined by the appended claims.

What is claimed is:

1. A method of simulating cycles of a digital device on a computer system, comprising the steps of:

assigning input bits of the digital device to an input vector of a first cycle;

building an abstract data structure representing each element of the device, wherein each abstract data structure has at least one input and wherein each input bit in the input vector is associated with at least one input of the abstract data structure;

grouping identical abstract data structures to form at least one group;

transforming the input vector into output bits simulating the first cycle of the digital device; and storing the output bits in an output vector of the first cycle.

2. The method of claim 1, wherein the abstract data structures are abstract syntax trees having a root, a node, and at least one leaf.

3. The method of claim 1, wherein the transforming step comprises the step of:

generating machine instructions for the at least one group, wherein the machine instructions perform the digital operations and wherein the machine instructions loop for each abstract data structure in the at least one group.

4. The method of claim 1, further comprising the step of:

mapping the output bits in the output vector to input bits of an input vector of a second cycle.

5. A method of simulating a digital device on a computer system having a CPU and a memory, the method comprising the steps of:

representing each bit calculation performed by the digital device as an abstract data structure stored in the memory, wherein each abstract data structure has at least one input bit and an output bit;

grouping identical abstract data structures to produce at least one group performing a bit calculation;

assigning output bits of the identical abstract data structures in the at least one group to offsets in an output word vector;

mapping the output bits in the output word vector to an input word vector wherein each bit in the input word vector is an input to a particular abstract data structure; and generating CPU instructions for the at least one group, wherein the CPU instructions, when executing on the CPU, perform the bit calculation on the input word vector and produce the output bits.

6. The method of claim 5, wherein the abstract data structures are abstract syntax trees having a root, a node, and at least one leaf.

7. The method of claim 6, wherein the root of each abstract syntax tree represents an output bit and each node of each abstract syntax tree represents a digital operation.

8. The method of claim 5, wherein the grouping step comprises the step of:

performing a topological sort on the abstract data structures.

9. The method of claim 5, wherein the assigning step comprises the steps of:

sequentially assigning the output bits to offsets of a first CPU word;

sequentially assigning the output bits to a second CPU word if the number of output bits exceeds the number of offsets in the first CPU word;

concatenating the second CPU word to an end of the first CPU word.

10. The method of claim 5, wherein the mapping step comprises the steps of:

looking up an output bit in an associated entry in a lookup table; and determining, from the entry, at least one offset in the input word vector to which the output bit maps.

11. The method of claim 10, further comprising the step of:

copying the output bit to each offset in the input word vector to which the output bit maps.

12. The method of claim 5, wherein the generating step further comprises the step of:

generating loop code around the CPU instructions causing the CPU instructions to iterate for each abstract data structure in the at least one group.

13. The method of claim 5, further comprising the step of:

checking the abstract data structures for data dependencies before grouping.

14. A computer program product having a computer readable medium having computer program logic recorded thereon for simulating cycles of a digital device having digital components, wherein each component receives at least one input bit and generates an output bit therefrom, in a computer system having a CPU and a memory, the computer program product comprising:

means for storing an abstract representation of each component in the memory;

means for assigning an output bit of each abstract representation to an output vector;

means for mapping each output bit in the output vector to at least one offset in an input vector; and means for generating a set of CPU instructions for each unique abstract representation, wherein each set of CPU instructions operates on at least one input bit from the input vector to produce an output bit.

15. The computer program product of claim 14, wherein the abstract representation is an abstract syntax tree and wherein a root of the abstract syntax tree represents an output bit and a node of the abstract syntax tree represents a binary operation.

16. The computer program product of claim 14, further comprising:

means for sorting the abstract representations to produce at least one group of identical abstract representations.

17. The computer program product of claim 16, further comprising:

means for generating looping CPU instructions around the sets of CPU instructions for groups of identical abstract representations having a plurality of members.

18. The computer program product of claim 14, further comprising:

means for copying each output bit in the output vector to at least one offset in the input vector to which the output bit maps.

19. The computer program product of claim 14, further comprising:

means for checking the abstract representations for data dependencies before grouping.

\* \* \* \* \*